United States Patent
Park

(10) Patent No.: US 9,425,356 B2
(45) Date of Patent: Aug. 23, 2016

(54) LIGHT EMITTING DEVICE

(71) Applicant: LG INNOTEK CO., LTD., Seoul (KR)

(72) Inventor: Bum Doo Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/631,258

(22) Filed: Feb. 25, 2015

(65) Prior Publication Data
US 2015/0295135 A1  Oct. 15, 2015

(30) Foreign Application Priority Data

Apr. 15, 2014 (KR) .......................... 10-2014-0044558

(51) Int. Cl.
| | | |
|---|---|---|
| *H01L 33/00* | (2010.01) | |
| *H01L 33/38* | (2010.01) | |
| *H01L 33/22* | (2010.01) | |
| *H01L 33/40* | (2010.01) | |
| *H01L 33/44* | (2010.01) | |

(52) U.S. Cl.
CPC .................. *H01L 33/38* (2013.01); *H01L 33/22* (2013.01); *H01L 33/405* (2013.01); *H01L 33/44* (2013.01)

(58) Field of Classification Search
None
See application file for complete search history.

(56) References Cited

U.S. PATENT DOCUMENTS

| | | | |
|---|---|---|---|
| 2010/0219442 A1* | 9/2010 | Lee ..................... | H01L 33/0079 257/99 |
| 2011/0220936 A1* | 9/2011 | Fujimoto ................ | H01L 33/38 257/98 |
| 2011/0255294 A1* | 10/2011 | Okabe ................... | H01L 33/405 362/362 |
| 2011/0255924 A1* | 10/2011 | Choi ....................... | B23C 5/202 407/42 |

* cited by examiner

*Primary Examiner* — Ali Naraghi
(74) *Attorney, Agent, or Firm* — KED & Associates, LLP

(57) ABSTRACT

A light emitting device includes a light emitting structure having a first conductive semiconductor layer, an active layer under the first conductive semiconductor layer, and a second conductive semiconductor layer under the active layer; a first electrode disposed on the light emitting structure, configured as a plurality of dots and electrically connected to the first conductive semiconductor layer; an electrode pad electrically connected to the first electrode; and a second electrode electrically connected to the second conductive semiconductor layer.

14 Claims, 8 Drawing Sheets

LIGHT EMITTING DEVICE

CROSS-REFERENCE TO RELATED APPLICATION

This application claims priority under 35 U.S.C. §119 to Korean Patent Application No. 10-2014-0044558 filed on Apr. 15, 2014, which is incorporated herein by reference.

BACKGROUND

1. Field

The embodiment relates to a light emitting device, a light emitting device package, and a light unit.

2. Background

A light emitting diode (LED) has been extensively used as one of light emitting devices. The LED converts electrical signals into the form of light such as infra-red light, ultraviolet light, and visible light by using the characteristic of a compound semiconductor. As the light efficiency of the light emitting device is increased, the LED has been used in various fields such as display apparatuses and lighting appliances.

BRIEF DESCRIPTION OF THE DRAWINGS

The embodiments will be described in detail with reference to the following drawings in which like reference numerals refer to like elements wherein.

DETAILED DESCRIPTION

Figure 1:
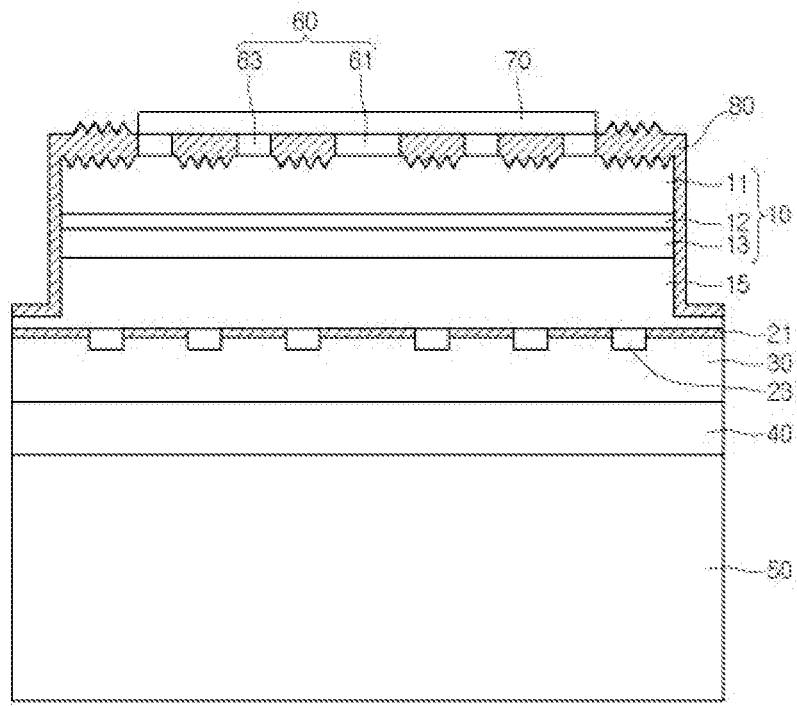
FIG. 1 is a view showing a light emitting device according to the embodiment.

FIG. 1 is a view showing a light emitting device according to the embodiment. The light emitting device may include a light emitting structure 10, a first electrode 60 and an electrode pad 70.

The light emitting structure 10 may include a first conductive semiconductor layer 11, an active layer 12, and a second conductive semiconductor layer 13. The active layer 12 may be interposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

For example, the first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of $(Al_xGa_{1-x})_yIn_{1-y}P$ ($0 \leq x \leq 1$, $0 \leq y \leq 1$). In the above compositional formula, y may have a value of 0.5 and x may have a value of 0.5 to 0.8. The first conductive semiconductor layer 11 may include one selected from the group consisting of AlGaInP, AlInP, GaP and GaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of $(Al_xGa_{1-x})_yIn_{1-y}P$ ($0 \leq x \leq 1$, $0 \leq y \leq 1$). The active layer 12 may include one selected from the group consisting of AlGaInP, AlInP, GaP and GaInP. When the active layer 12 has an MQW structure, the active layer 12 may be formed by stacking a plurality of well layers and a plurality of barrier layers.

For example, the second conductive semiconductor layer 13 may include a P-type semiconductor layer. The second conductive semiconductor layer 13 may be realized by using a compound semiconductor. The second conductive semiconductor layer 13 may be realized by using a group II-VI compound semiconductor, or a group III-V compound semiconductor.

For example, the second conductive semiconductor layer 13 may be realized by using a semiconductor material having a compositional formula of $(Al_xGa_{1-x})_yIn_{1-y}P$ ($0 \leq x \leq 1$, $0 \leq y \leq 1$). The second conductive semiconductor layer 13 may include one selected from the group consisting of AlGaInP, AlInP, GaP and GaInP doped with P-type dopants such as Mg, Zn, Ca, Sr, Ba and C. The light emitting structure 10 may include at least two elements selected from the group consisting of Al, Ga, In and P.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the first light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the first light emitting structure 10 may have various structures, and the embodiment is not limited thereto.

The light emitting device according to the embodiment may include a window layer 15. The window layer 15 may be realized by using a semiconductor material having a compositional formula of $(Al_xGa_{1-x})_yIn_{1-y}P$ ($0 \leq x \leq 1$, $0 \leq y \leq 1$). For example, the window layer 15 may include one selected from the group consisting of AlGaInP, AlInP, GaP and GaInP. The window layer 15 may be disposed under the second conductive semiconductor layer 13. The window layer 15 may provide a current spreading effect.

The light emitting device according to the embodiment may include an ODR (Omni Directional Reflector) layer 21, an ohmic contact layer 23 and a reflective layer 30. The ODR layer 21 may have a function of reflecting light in the upward direction as the light is incident thereto from the top. For example, the ODR layer 21 may have a reflective index lower than that of the light emitting structure 10. The ODR layer 21 may include a material having a reflective index greatly lower than that of a material constituting the light emitting structure 10 to provide the reflective function. The ODR layer 21 may make contact with the window layer 15.

The ODR layer 21 may include oxide or nitride. For instance, the ODR layer 21 may include at least one selected from the group consisting of an $SiO_2$, $SiN_x$, an ITO (Indium-Tin-Oxide), an IZO (Indium-Zinc-Oxide), an AZO (Aluminum-Zinc-Oxide), an ATO (Antimony-Tin-Oxide), an IZTO (Indium-Zinc-Tin-Oxide), an IAZO (Indium-Aluminum-Zinc-Oxide), a GZO (Gallium-Zinc-Oxide), an IGZO (Indium-Gallium-Zinc-Oxide), an IGTO (Indium-Gallium-Tin-Oxide), and an AZO (Aluminum-Zinc-Oxide).

The ohmic contact layer 23 may come into ohmic-contact with the window layer 15. The ohmic contact layer 23 may include a region that makes ohmic-contact with the window layer 15. The ohmic contact layer 23 may be electrically connected to the light emitting structure 10. The ohmic contact layer 23 may extend by passing through the ODR layer 21. For example, the ohmic contact layer 23 may have an upper surface having a circular shape or an oval shape. The ohmic contact layer 23 may include at least one selected from the group consisting of Au, SnAu/AuBe/Au, AuZn, ITO, AuBe, and GeAu.

The reflective layer 30 may be disposed under the ohmic contact layer 23. The reflective layer 30 may be disposed under the ODR layer 21. The reflective layer 30 may reflect light in the upward direction as the light is incident thereto from the top. For instance, the reflective layer 30 may include at least one selected from the group consisting of Ag, Au and Al.

The light emitting device according to the embodiment may include a bonding layer 40 and a support substrate 50. The bonding layer 40 has a function of bonding the reflective layer 30 to the support substrate 50.

The bonding layer 40, for example, may include at least one selected from the group consisting of Sn, AuSn, Pd, Al, Ti, Au, Ni, Cr, Ga, In, Bi, Cu, Ag, Nb, and Ti/Au/In/Au. The support substrate 50 may include at least one of Ti, Cr, Ni, Al, Pt, Au, W, Cu, Mo, Cu—W and a semiconductor substrate implanted with impurities (e.g., Si, Ge, GaN, GaAs, ZnO, SiC, and SiGe).

The light emitting device according to the embodiment may include the first electrode 60 and the electrode pad 70 disposed on the light emitting structure 10.

The first electrode 60 may be electrically connected to the first conductive semiconductor layer 11. The first electrode 60 may come into contact with the first conductive semiconductor layer 11. The first electrode 60 may come into ohmic-contact with the first conductive semiconductor layer 11. The first electrode 60 may include a region that makes contact with the light emitting structure 10. The first electrode 60 may include a region that makes contact with the first conductive semiconductor layer 11. The first electrode 60 may include at least one selected from the group consisting of Ge, Zn, Mg, Ca, Au, Ni, AuGe, and AuGe/Ni/Au.

The light emitting device according to the embodiment may include a highly-doped semiconductor layer disposed between the first electrode 60 and the first conductive semiconductor layer 11. For instance, the highly-doped semiconductor layer may include a GaAs layer. The highly-doped semiconductor layer may include impurities having polarity the same as that of the first conductive semiconductor layer 11. The doping concentration of the highly-doped semiconductor layer may be higher than that of the first conductive semiconductor layer 11.

The electrode pad 70 may be electrically connected to the first electrode 60. The electrode pad 70 may be disposed on the first electrode 60. The electrode pad 70 may come into contact with a top surface of the first electrode 60. The electrode pad 70 may be connected to an external power source to supply power to the light emitting structure 10. The electrode pad 70 may include at least one selected from the group consisting of Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The light emitting device according to the embodiment may include a protective layer 80. The protective layer 80 may be disposed on the light emitting structure 10. The protective layer 80 may be disposed around the light emitting structure 10. The protective layer 80 may be disposed at a lateral side of the light emitting structure 10. The protective layer 80 may be disposed around the window layer 15. A portion of the protective layer 80 may be disposed on a portion of the window layer 15.

The protective layer 80 may include at least one of oxide and nitride. For example, the protective layer 80 may include at least one selected from the group consisting of $SiO_2$, $Si_xO_y$, $Si_3N_4$, $Si_xN_y$, $SiO_xN_y$, $Al_2O_3$, $TiO_2$, and AlN.

Figure 2:
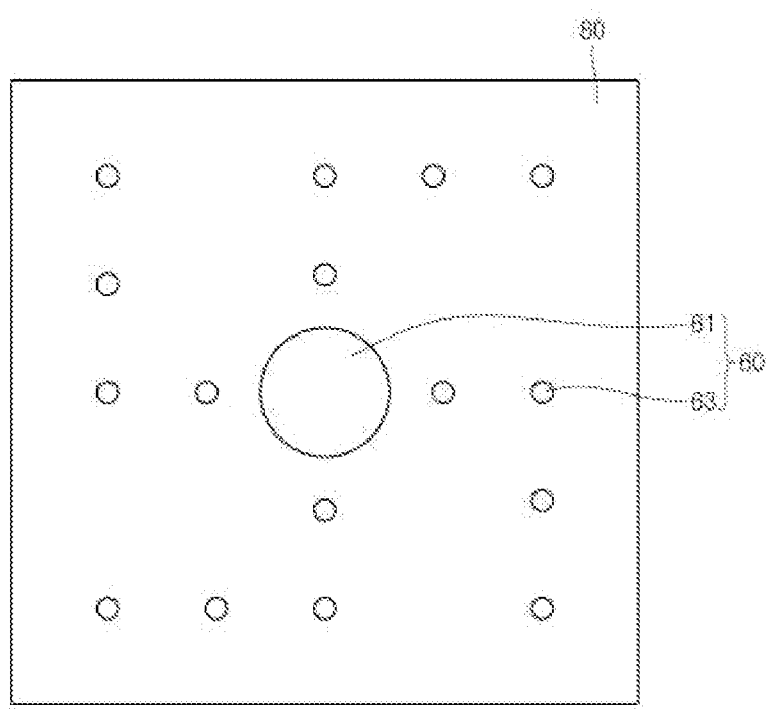
FIG. 2 is a view showing an example of a first electrode applied to a light emitting device according to the embodiment.
Figure 3:
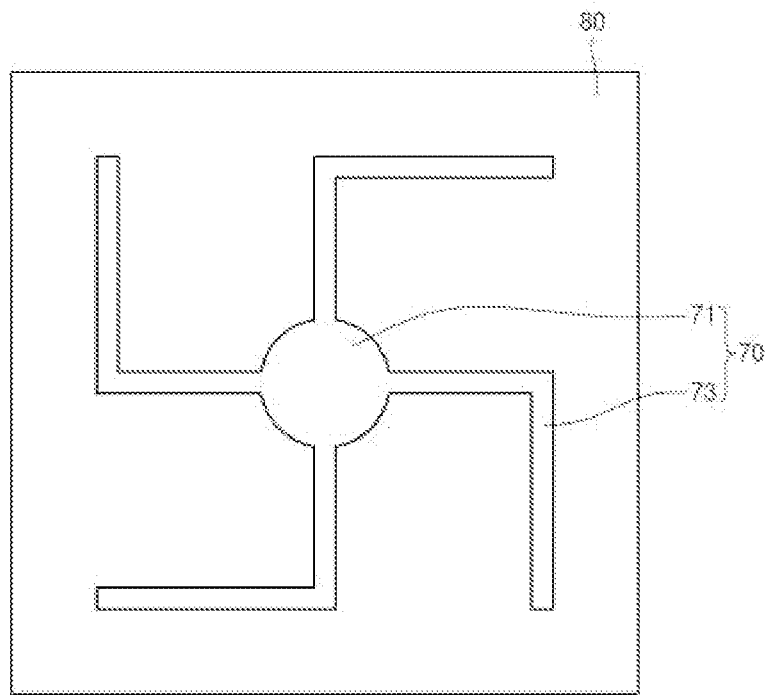
FIG. 3 is a view showing an example of an electrode pad applied to a light emitting device according to the embodiment.

FIG. 2 is a plan view showing the first electrode 60 applied to the light emitting device according to the embodiment and FIG. 3 is a plan view showing the electrode pad 70 applied to the light emitting device according to the embodiment.

The first electrode 60 according to the embodiment may be disposed on the light emitting structure 10. The first electrode 60 may include a main electrode 61 and a peripheral electrode 63. The main electrode 61 and the peripheral electrode 63 may be spaced apart from each other on the light emitting structure 10. A plurality of peripheral electrodes 63 may be provided.

The main electrode 61 and the peripheral electrode 63 may be provided in the form of dots. The main electrode 61 and the peripheral electrode 63 may have the same size or mutually different sizes. The peripheral electrode 63 may be configured in the form of a plurality of dots with mutually different sizes. For example, the size of the peripheral electrodes 63 may be gradually reduced as the peripheral electrodes 63 are located away from the main electrode 61. The peripheral electrode 63 may have a width in the range of 4 μm to 5 μm. The main electrode 61 and the peripheral electrode 63 may have upper surfaces having a circular shape or a polygonal shape.

The first electrode 60 may be electrically connected to the first conductive semiconductor layer 11. The main electrode 62 may be electrically connected to the first conductive semiconductor layer 11. The peripheral electrode 63 may be electrically connected to the first conductive semiconductor layer 11.

According to the embodiment, the electrode pad 70 may include a main pad 71 and a finger pad 73. The finger pad 73 may be electrically connected to the main pad 71. The finger pad 73 may branch from the main pad 71. For example, power may be applied to the main pad 71 from the outside. The finger pad 73 may extend outward from the main pad 71. The finger pad 73 may have a symmetrical structure. The finger pad 73 may have an asymmetrical structure.

The electrode pad 70 may be electrically connected to the first electrode 60. The electrode pad 70 may be electrically connected to the main electrode 61. The electrode pad 70 may be electrically connected to the peripheral electrode 63.

According to the embodiment, the main pad 71 may be disposed on the main electrode 61. The main pad 71 may come into contact with the main electrode 61. For instance, the main pad 71 may have an area equal to an area of the main electrode 61. Alternatively, the main pad 71 may have an area smaller than an area of the main electrode 61. Further, the main pad 71 may have an area larger than an area of the main electrode 61. If the main pad 71 has an area larger than an area of the main electrode 61, the protective layer 80 may be disposed under the main pad 71.

The finger pad 73 may be disposed on the peripheral electrode 63. The finger pad 73 may come into contact with the peripheral electrode 63. The finger pad 73 may come into contact with a plurality of peripheral electrodes 63. The finger pad 73 may electrically connect the main electrode 61 to at least one of the peripheral electrodes 63. The finger pad 73 may electrically connect the peripheral electrodes 63 to each other.

For example, the first electrode 60 may include a first region (the main electrode 61 or one of the peripheral electrodes 63) and a second region (the other peripheral electrode 63), which are spaced apart from each other, and the electrode pad 70 may be electrically connected to the first and second regions. The finger pad 73 has a width equal to or different from a width of the peripheral electrode 63. For instance, the finger pad 73 may have a width in the range of 4 μm to 5 μm.

According to the embodiment, the protective layer 80 may be disposed on the light emitting structure 10. The protective layer 80 may be disposed on the first conductive semiconductor layer 11. The first conductive semiconductor layer 11 may be formed on a top surface thereof with a light extraction structure. The protective layer 80 may include a light extraction structure corresponding to the light extraction structure of the first conductive semiconductor layer 11.

The protective layer 80 may include a plurality of through holes. The main electrode 61 and the peripheral electrode 63 may be provided in the through holes. The through holes may have a size equal to a size of the main electrode 61 or the peripheral electrode 63 corresponding to the through holes. For instance, the through hole may have a width in the range of 4 μm to 5 μm.

The first electrode 60 may include a plurality of metal dots provided in the through holes, respectively, so as to be electrically connected to the first conductive semiconductor layer 11. The protective layer 80 may be disposed around the first electrode 60 configured as a plurality of dots. A partial region of the protective layer 80 may be disposed under the electrode pad 70. For instance, the protective layer 80 disposed between adjacent peripheral electrodes 63 may be positioned under the finger pad 73. If the main pad 71 has an area larger than an area of the main electrode 61, the protective layer 80 may be disposed under the main pad 71. The protective layer 80 may be disposed between the main pad 71 and the first conductive semiconductor layer 11.

The first electrode 60 may include a plurality of regions spaced apart from each other and electrically connected to each other by the electrode pad 70. An external power source connected to the electrode pad 70 may apply power to the main electrode 61 and the peripheral electrode 63 through the main pad 71 and the finger pad 73. The external power source connected to the electrode pad 70 may apply power to the first conductive semiconductor layer 11 through the first electrode 60.

The main electrode 61 and the peripheral electrode 63 may be variously arranged. The main pad 71 and the finger pad 73 may be variously arranged corresponding to the arrangement of the main electrode 61 and the peripheral electrode 63.

The main electrode 61 and the peripheral electrode 63 may come into ohmic-contact with the first conductive semiconductor layer 11. An ohmic contact between a metal layer and a semiconductor layer can be achieved through the heat treatment process after the metal layer has been formed on the semiconductor layer. At this time, a diffusion area may be formed between the metal layer and the semiconductor layer through the heat treatment process and light absorption may occur in the diffusion area. The light extraction efficiency from the light emitting structure to the outside may be reduced as the size of the diffusion area becomes enlarged.

Figure 4:
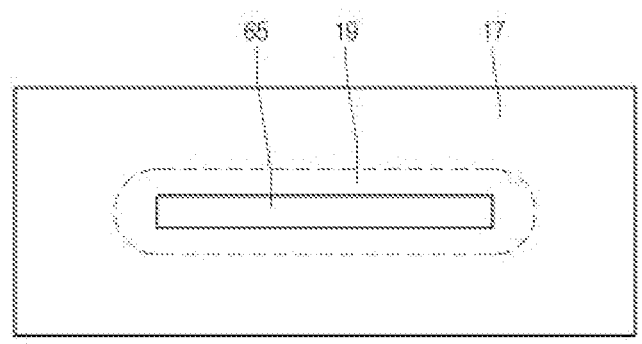
FIGS. 4 to 7 are views to explain difference between an ohmic contact region applied to a light emitting device according to the embodiment and an ohmic contact region applied to a light emitting device according to a related art.
Figure 5:
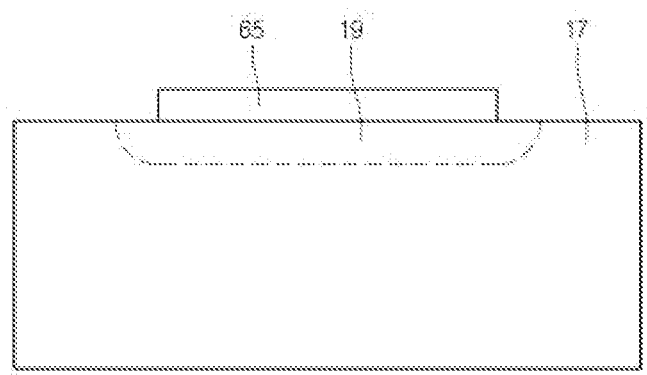
Figure 6:
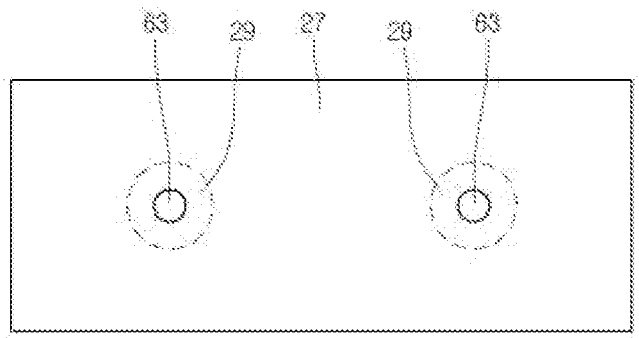
Figure 7:
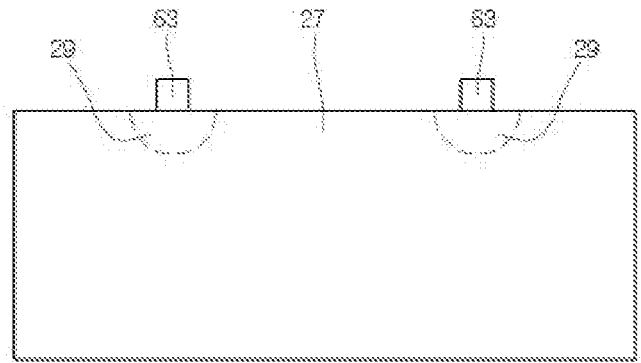

FIGS. 4 and 5 show an ohmic contact region applied to the light emitting device of related art, and FIGS. 6 and 7 show an ohmic contact region applied to the light emitting device of the embodiment.

In the case of the light emitting device according to the related art, as shown in FIGS. 4 and 5, a diffusion area 19 is provided between a metal layer 65 having a predetermined length and a semiconductor layer 17. In this case, the diffusion area 19 may be formed at a peripheral portion and a lower portion of the metal layer 65.

In contrast, in the case of the light emitting device according to the embodiment, as shown in FIGS. 6 and 7, a diffusion area 29 is formed between a plurality of dots 63 and a semiconductor layer 27. At this time, the dots 63 occupy a small area, so the diffusion area 29 is formed as a small area. According to the embodiment, the diffusion area 29 may be prepared as a small area when forming the ohmic contact region, so the quantity of light absorbed in the diffusion area 29 may be reduced, thereby increasing the quantity of light extracted to the outside.

Since the first electrode 60 is divided into the main electrode 61 and the peripheral electrode 63, which are spaced apart from each other, the first electrode 60 having a smaller area may be provided on the light emitting structure 10 as compared with the light emitting device according to the related art. The light emitting device according to the embodiment can improve the light extraction efficiency. In addition, the main electrode 61 and the peripheral electrode 63 may be uniformly distributed on the first conductive semiconductor layer 11 such that the current spreading effect can be improved.

According to the embodiment, as shown in FIG. 1, the support substrate 50 may have electrical conductivity so power can be applied to the light emitting structure 10 from the external light source connected to the support substrate 50. Thus, power can be applied to the second conductive semiconductor layer 13 through the support substrate 50. In addition, according to the embodiment, the second electrode electrically connected to the second conductive semiconductor layer 13 may include at least one of the ohmic contact layer 23, the reflective layer 40, the bonding layer 40 and the support substrate 50.

Figure 8:
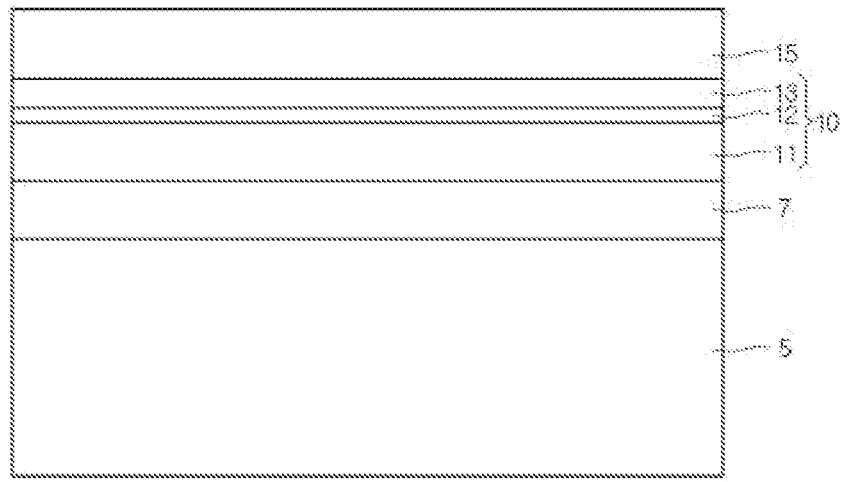
FIGS. 8 to 11 are views showing a method of manufacturing a light emitting device according to the embodiment.

A method of fabricating the light emitting device according to the embodiment will be described with reference to FIGS. 8 to 11. As shown in FIG. 8, an etch stop layer 7, the first conductive semiconductor layer 11, the active layer 12, the second conductive semiconductor layer 13 and the window layer 15 may be formed on a substrate 5. The first conductive semiconductor layer 11, the active layer 12, and the second conductive semiconductor layer 13 may constitute the light emitting structure 10.

For example, the substrate 5 may include at least one of a sapphire substrate ($Al_2O_3$), SiC, GaAs, GaN, ZnO, Si, GaP, InP, and Ge, but the embodiment is not limited thereto. A buffer layer may be interposed between the substrate 5 and the etch stop layer 7. The etch stop layer 7 may be formed of a semiconductor material having a compositional formula of $(Al_xGa_{1-x})_yIn_{1-y}P$ ($0 \le x \le 1$, $0 \le y \le 1$). The function of the etch stop layer 7 will be further described later.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. Alternatively, the first conductive semiconductor layer 11 may include a P-type semiconductor layer, and the second conductive semiconductor layer 13 may include an N-type semiconductor layer.

The first conductive semiconductor layer 11 may include an N-type semiconductor. The first conductive semiconductor layer 11 may be formed of a compound semiconductor. For example, the first conductive semiconductor layer 11 may be realized by using a group II-VI compound semiconductor, or a group III-V compound semiconductor.

The first conductive semiconductor layer 11 may be realized by using a semiconductor material having a compositional formula of $(Al_xGa_{1-x})_yIn_{1-y}P$ ($0 \le x \le 1$, $0 \le y \le 1$). In the above compositional formula, y may have a value of 0.5 and x may have a value of 0.5 to 0.8. For example, the first conductive semiconductor layer 11 may include one selected from the group consisting of AlGaInP, AlInP, GaP and GaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. For instance, the active layer 12 may be formed of a group II-VI compound semiconductor, or a group III-V compound semiconductor. The active layer 12 may be realized by using a semiconductor material having a compositional formula of $(Al_xGa_{1-x})_yIn_{1-y}P$ ($0 \le x \le 1$, $0 \le y \le 1$). The active layer 12 may include one selected from the group consisting of AlGaInP, AlInP, GaP and GaInP. When the active layer 12 has an MQW structure, the active layer 12 may be formed by stacking a plurality of well layers and a plurality of barrier layers.

For example, the second conductive semiconductor layer 13 may include a P-type semiconductor layer. The second conductive semiconductor layer 13 may be realized by using a compound semiconductor. For example, the second conductive semiconductor layer 13 may be realized by using a group II-VI compound semiconductor, or a group III-V compound semiconductor.

For example, the second conductive semiconductor layer 13 may be realized by using a semiconductor material having a compositional formula of $(Al_xGa_{1-x})_yIn_{1-y}P$ ($0 \le x \le 1$, $0 \le y \le 1$). For example, the second conductive semiconductor layer 13 may include one selected from the group consisting of AlGaInP, AlInP, GaP and GaInP doped with P-type dopants such as Mg, Zn, Ca, Sr, Ba and C. For instance, the light emitting structure 10 may include at least two elements selected from the group consisting of Al, Ga, In and P.

The window layer 15 may be realized by using a semiconductor material having a compositional formula of $(Al_xGa_{1-x})_yIn_{1-y}P$ ($0 \le y \le 1$). For example, the window layer 15 may include one selected from the group consisting of AlGaInP, AlInP, GaP and GaInP. The window layer 15 may provide a current spreading effect when the light emitting device is driven.

Figure 9:
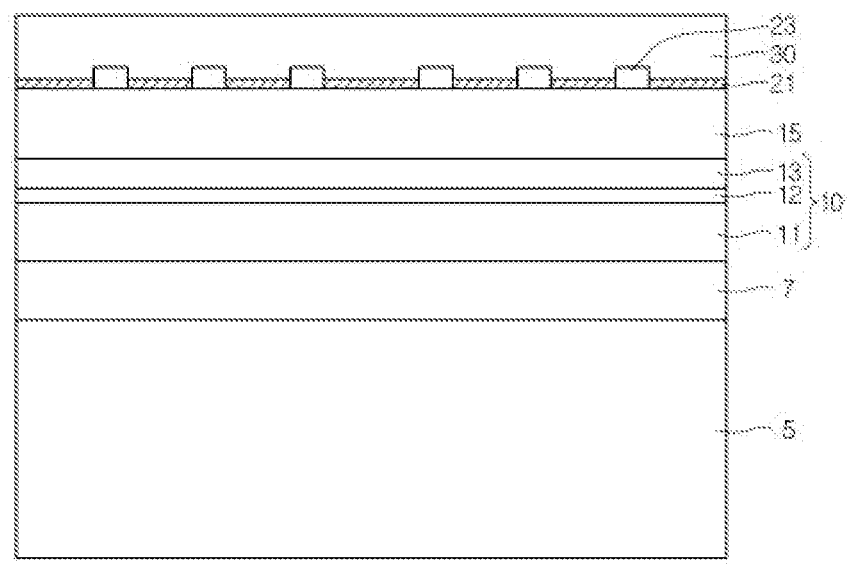

Then, as shown in FIG. 9, the ODR layer 21, the ohmic contact layer 23 and the reflective layer 30 may be formed on the window layer 15. The ODR layer 21 may have a function of reflecting light incident thereto. For example, the ODR layer 21 may have a reflective index lower than that of the light emitting structure 10. The ODR layer 21 may include a material having a reflective index greatly lower than that of a material constituting the light emitting structure 10 to provide the reflective function. The ODR layer 21 may make contact with the window layer 15.

The ODR layer 21 may include oxide or nitride. For instance, the ODR layer 21 may include at least one selected from the group consisting of an $SiO_2$, $SiN_x$, an ITO (Indium-Tin-Oxide), an IZO (Indium-Zinc-Oxide), an AZO (Aluminum-Zinc-Oxide), an ATO (Antimony-Tin-Oxide), an IZTO (Indium-Zinc-Tin-Oxide), an IAZO (Indium-Aluminum-Zinc-Oxide), a GZO (Gallium-Zinc-Oxide), an IGZO (Indium-Gallium-Zinc-Oxide), an IGTO (Indium-Gallium-Tin-Oxide), and an AZO (Aluminum-Zinc-Oxide).

The ohmic contact layer 23 may come into ohmic-contact with the window layer 15. The ohmic contact layer 23 may include a region that makes ohmic-contact with the window layer 15. The ohmic contact layer 23 may be electrically connected to the light emitting structure 10. The ohmic contact layer 23 may extend by passing through the ODR layer 21. For instance, the ohmic contact layer 23 may have an upper surface having a circular shape or an oval shape. For example, the ohmic contact layer 23 may include at least one selected from the group consisting of Au, SnAu/Au Be/Au, AuZn, ITO, Au Be, and GeAu.

The reflective layer 30 may be disposed on the ohmic contact layer 23. The reflective layer 30 may be disposed on the ODR layer 21. The reflective layer 30 may reflect light incident thereto. For instance, the reflective layer 30 may include at least one selected from the group consisting of Ag, Au and Al.

Figure 10:
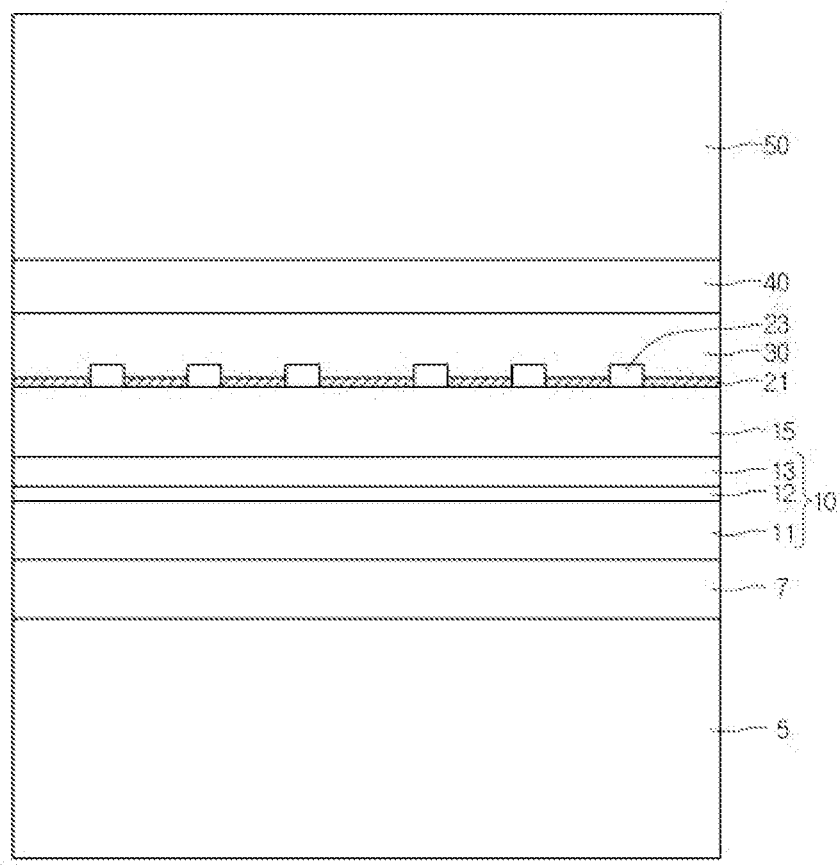

As shown in FIG. 10, the bonding layer 40 and the support substrate 50 may be formed on the reflective layer 30. The bonding layer 40 has a function of bonding the reflective layer 30 to the support substrate 50. The bonding layer 40, for example, may include at least one selected from the group consisting of Sn, AuSn, Pd, Al, Ti, Au, Ni, Cr, Ga, In, Bi, Cu, Ag, Nb, and Ti/Au/In/Au. The support substrate 50 may include at least one of Ti, Cr, Ni, Al, Pt, Au, W, Cu, Mo, Cu—W and a semiconductor substrate implanted with impurities (e.g., Si, Ge, GaN, GaAs, ZnO, SiC, and SiGe).

Then, the substrate 5 is removed from the etch stop layer 7. As one example, the substrate 5 may be removed through an etch process. If the substrate 5 is formed of GaAs, the substrate 5 may be removed through a wet etch process and the etch stop layer 7 is not etched, so that only is the substrate 5 removed. The etch stop layer 7 may be separated from the light emitting structure 10 through an additional removal process. For instance, the etch stop layer 7 may be separated from the light emitting structure 10 through an additional etching process. For example, the etch stop layer 7 may be formed of a semiconductor material having a compositional formula of $(Al_xGa_{1-x})_yIn_{1-y}P$ ($0 \le x \le 1$, $0 \le y \le 1$).

Figure 11:
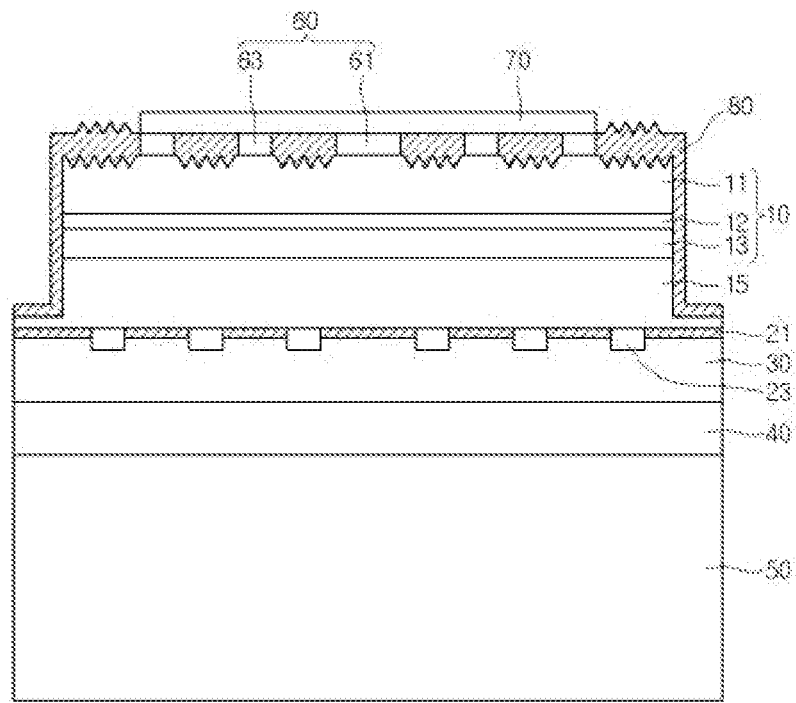

As shown in FIG. 11, the first electrode 60 may be formed on the light emitting structure 10 and the light extraction structure may be formed on the first conductive semiconductor layer 11. After that, an isolation process may be performed to etch lateral sides of the light emitting structure 10. The protective layer 80 and the electrode pad 70 may be formed on the light emitting structure 10.

The first electrode 60 according to the embodiment may be disposed on the light emitting structure 10. As shown in FIGS. 2 and 11, the first electrode 60 may include the main electrode 61 and the peripheral electrode 63. The main electrode 61 and the peripheral electrode 63 may be spaced apart from each other on the light emitting structure 10. A plurality of peripheral electrodes 63 may be provided. The main electrode 61 and the peripheral electrode 63 may be provided in the form of dots. The main electrode 61 and the peripheral electrode 63 may have the same size or mutually different sizes. The peripheral electrode 63 may be configured in the form of a plurality of dots with mutually different sizes. For example, the size of the peripheral electrodes 63 may be gradually reduced as the peripheral electrodes 63 are located away from the main electrode 61. The peripheral electrode 63 may have a width in the range of 4 μm to 5 μm.

The first electrode 60 may be electrically connected to the first conductive semiconductor layer 11. The main electrode 62 may be electrically connected to the first conductive semiconductor layer 11. The peripheral electrode 63 may be electrically connected to the first conductive semiconductor layer 11.

According to the embodiment, as shown in FIGS. 3 and 11, the electrode pad 70 may include the main pad 71 and the finger pad 73. The finger pad 73 may be electrically connected to the main pad 71. For example, power may be applied to the main pad 71 from the outside. The finger pad 73 may extend outward from the main pad 71. The finger pad 73 may have a symmetrical structure. The finger pad 73 may have an asymmetrical structure.

The electrode pad 70 may be electrically connected to the first electrode 60. The electrode pad 70 may be electrically connected to the main electrode 61. The electrode pad 70 may be electrically connected to the peripheral electrode 63.

According to the embodiment, the main pad 71 may be disposed on the main electrode 61. The main pad 71 may come into contact with the main electrode 61. For instance, the main pad 71 may have an area equal to an area of the main electrode 61. In addition, the main pad 71 may have an area smaller than an area of the main electrode 61. Further, the main pad 71 may have an area larger than an area of the main electrode 61. If the main pad 71 has an area larger than an area of the main electrode 61, the protective layer 80 may be disposed under the main pad 71.

The finger pad 73 may be disposed on the peripheral electrode 63. The finger pad 73 may come into contact with the peripheral electrode 63. The finger pad 73 may come into contact with a plurality of peripheral electrodes 63. The finger pad 73 may electrically connect the main electrode 61 to at least one of the peripheral electrodes 63. The finger pad 73 may electrically connect the peripheral electrodes 63 to each other.

For example, the first electrode 60 may include a first region (the main electrode 61 or one of the peripheral electrodes 63) and a second region (the other peripheral electrode 63), which are spaced apart from each other, and the electrode pad 70 may be electrically connected to the first and second regions.

The finger pad 73 has a width equal to or different from a width of the peripheral electrode 63. For instance, the finger pad 73 may have a width in the range of 4 μm to 5 μm.

According to the embodiment, the protective layer 80 may be disposed on the light emitting structure 10. The protective layer 80 may be disposed on the first conductive semiconductor layer 11. The first conductive semiconductor layer 11 may be formed on a top surface thereof with a light extraction structure. The protective layer 80 may include a light extraction structure corresponding to the light extraction structure of the first conductive semiconductor layer 11.

The protective layer 80 may include a plurality of through holes. The main electrode 61 and the peripheral electrode 63 may be provided in the through holes. The through holes may have a size equal to a size of the main electrode 61 or the peripheral electrode 63 corresponding to the through holes. For instance, the through hole may have a width in the range of 4 μm to 5 μm.

According to the embodiment, the first electrode 60 may include a plurality of metal dots provided in the through holes, respectively, so as to be electrically connected to the first conductive semiconductor layer 11. The protective layer 80 may be disposed around the first electrode 60 configured as a plurality of dots. A partial region of the protective layer 80 may be disposed under the electrode pad 70. For instance, the protective layer 80 disposed between adjacent peripheral electrodes 63 may be positioned under the finger pad 73. In addition, if the main pad 71 has an area larger than an area of the main electrode 61, the protective layer 80 may be disposed under the main pad 71. That is, the protective layer 80 may be disposed between the main pad 71 and the first conductive semiconductor layer 11.

According to the embodiment, the first electrode 60 may include a plurality of regions spaced apart from each other and electrically connected to each other by the electrode pad 70. In addition, an external power source connected to the electrode pad 70 may apply power to the main electrode 61 and the peripheral electrode 63 through the main pad 71 and the finger pad 73. Thus, the external power source connected to the electrode pad 70 may apply power to the first conductive semiconductor layer 11 through the first electrode 60.

According to the embodiment, the main electrode 61 and the peripheral electrode 63 may be variously arranged. In addition, the main pad 71 and the finger pad 73 may be variously arranged corresponding to the arrangement of the main electrode 61 and the peripheral electrode 63.

As described above, according to the light emitting device of the embodiment, since the first electrode 60 is divided into the main electrode 61 and the peripheral electrode 63, which are spaced apart from each other, the first electrode 60 having a smaller area may be provided on the light emitting structure 10 as compared with the light emitting device according to the related art.

Therefore, the light emitting device according to the embodiment can improve the light extraction efficiency. In addition, the main electrode 61 and the peripheral electrode 63 are uniformly distributed on the first conductive semiconductor layer 11, so that the current spreading effect can be improved.

Figure 12:
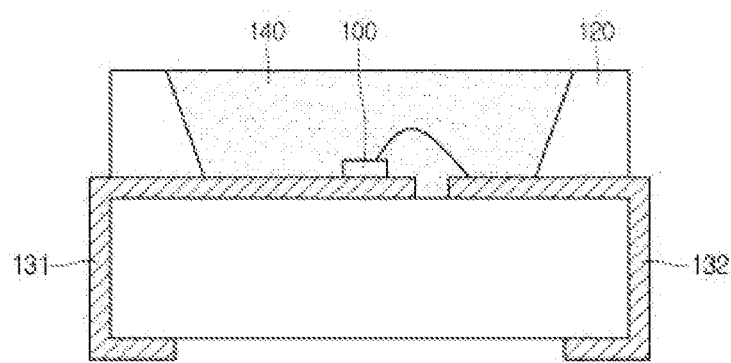
FIG. 12 is a view showing a light emitting device package according to the embodiment.

FIG. 12 is a view showing a light emitting device package to which the light emitting device according to the embodiment is applied. The light emitting device package according to the embodiment may include a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100. The body 120 may include silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 may dissipate heat generated from the light emitting device 100 to the outside.

The light emitting device 100 can be installed on the body 120 or the first or second lead electrode 131 or 132. The light emitting device 100 may be electrically connected to the first and second lead electrodes 131 and 132 through one of a wire scheme, a flip-chip scheme, and a die-bonding scheme. The molding member 140 may surround the light emitting device 100 to protect the light emitting device 100. The molding member 140 may include phosphors to change the wavelength of the light emitted from the light emitting device 100.

A plurality of light emitting device or light emitting device packages according to the embodiment may be arrayed on a substrate, and an optical member including a lens, a light guide plate, a prism sheet, or a diffusion sheet may be provided on the optical path of the light emitted from the light emitting device package. The light emitting device package, the substrate, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can include a light emitting device, or a light emitting device package according to the embodiment. For example, the lighting apparatus may include a lamp, a signal lamp, an electric sign board and a headlight of a vehicle.

Figure 14:
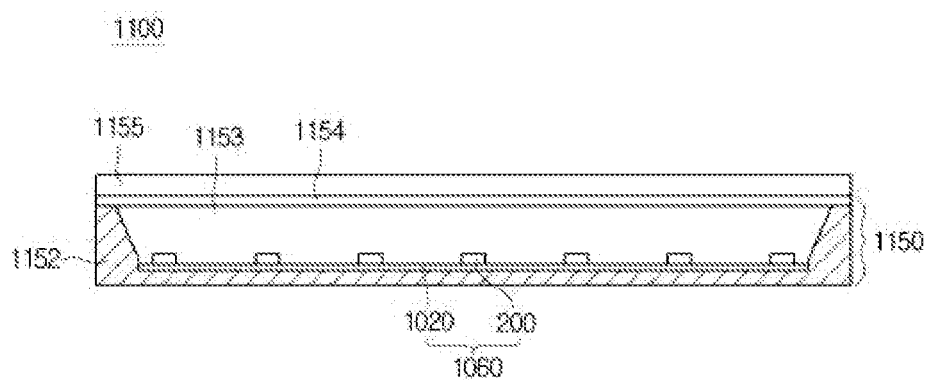
FIG. 14 is a view showing another example of the display device according to the embodiment.
Figure 15:
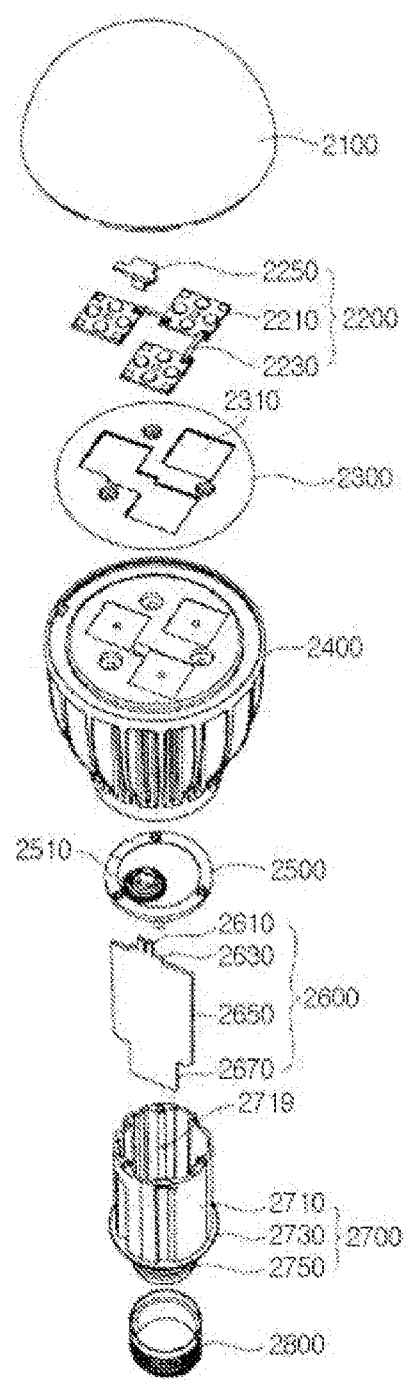
FIG. 15 is a view showing a lighting apparatus according to the embodiment.

The light emitting device according to the embodiment may be applied to the light unit. The light unit has a structure in which a plurality of light emitting devices are arrayed. The light unit may include a display device as shown in FIGS. 13 and 14 and the lighting apparatus as shown in FIG. 15.

Figure 13:
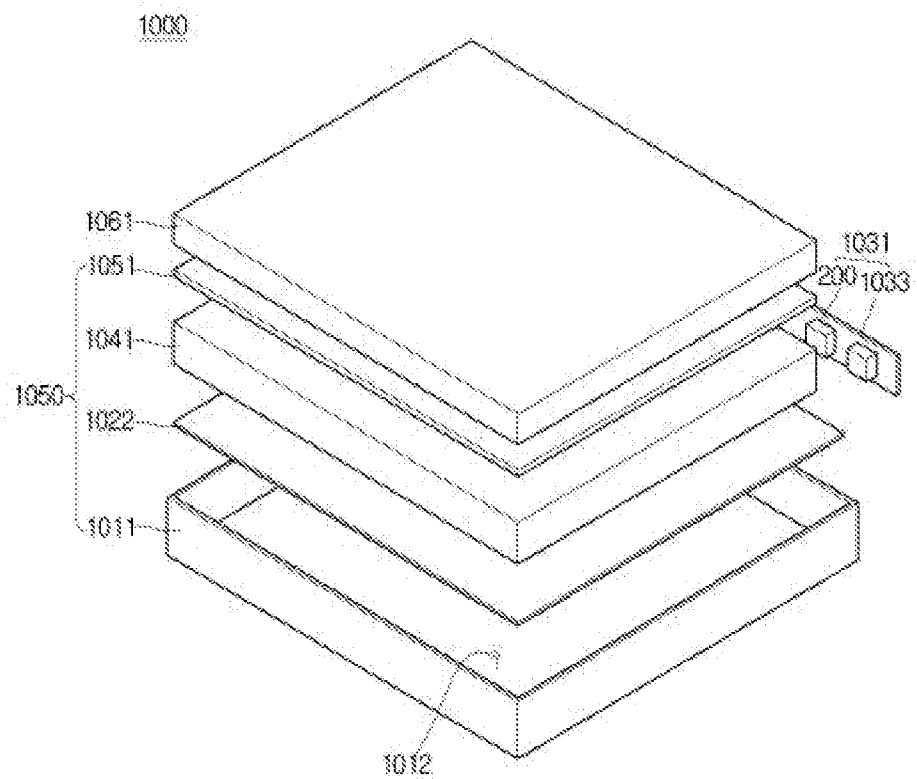
FIG. 13 is a view showing a display device according to the embodiment.

Referring to FIG. 13, a display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050. The light guide plate 1041 diffuses the light to provide surface light. The light guide plate 1041 may include transparent material. For example, the light guide plate 1041 may include one of acryl-based resin, such as PMMA (polymethyl methacrylate), PET (polyethylene terephthalate), PC (polycarbonate), COO (cyclic olefin copolymer) and PEN (polyethylene naphthalate) resin.

The light emitting module 1031 supplies the light to at least one side of the light guide plate 1041. The light emitting module 1031 serves as the light source of the display device. At least one light emitting module 1031 is provided to directly or indirectly supply the light from one side of the light guide plate 1041. The light emitting module 1031 may include a substrate 1033 and light emitting devices 100 or the light emitting device package 200 according to the embodiment described above. The light emitting packages 200 may be arrayed on the substrate 1033 while being spaced apart from each other at the predetermined interval.

The substrate 1033 may be a printed circuit board (PCB) including a circuit pattern. In addition, the substrate 1033 may also include a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the substrate 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and includes at least one transmissive sheet. For example, the optical sheet 1051 includes at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 14 is a view showing another example of a display device according to the embodiment. The display device 1100 includes a bottom cover 1152, a substrate 1020 on which the light emitting devices 100 are arrayed, an optical member 1154, and a display panel 1155. The substrate 1020 and the light emitting device packages 200 may constitute a light emitting module 1060. The bottom cover 1152 can be provided therein with a receiving section 1153, but the embodiment is not limited thereto.

The optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost. The optical member 1154 is disposed above the light emitting module 1060 in order to convert the light emitted from the light emitting module 1060 into the surface light. In addition, the optical member 1154 may diffuse or collect the light.

FIG. 15 is a view showing a lighting apparatus according to the embodiment. The lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may include a protrusion 2610, a guide part 2630, a base 2650, and an extension part 2670. The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device, a light emitting device package, and a light unit, capable of improving light extraction efficiency.

A light emitting device according to the embodiment includes a light emitting structure having a first conductive semiconductor layer, an active layer under the first conductive semiconductor layer, and a second conductive semiconductor layer under the active layer; a first electrode disposed on the light emitting structure, configured as a plurality of dots and electrically connected to the first conductive semiconductor layer; an electrode pad electrically connected to the first electrode; and a second electrode electrically connected to the second conductive semiconductor layer.

A light emitting device according to the embodiment includes a light emitting structure having a first conductive semiconductor layer, an active layer under the first conductive semiconductor layer, and a second conductive semiconductor layer under the active layer; a protective layer disposed on the light emitting structure and including a plurality of through holes; a first electrode including a plurality of metal dots provided in the through holes, respectively, so as to be electrically connected to the first conductive semiconductor layer; an electrode pad electrically connected to the first electrode; and a second electrode electrically connected to the second conductive semiconductor layer.

The light emitting device, the light emitting device package, and the light unit according to the embodiment can improve the light extraction efficiency. When a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising: a light emitting structure having a first conductive semiconductor layer, a second conductive semiconductor layer under the first conductive semiconductor layer, and an active layer between the first conductive semiconductor layer and the second conductive semiconductor layer; a first electrode configured as a plurality of dots and electrically coupled to the first conductive semiconductor layer; an electrode pad directly and electrically coupled to the first electrode; and a second electrode electrically coupled to the second conductive semiconductor layer, a protective layer provided around the first electrode configured as a plurality of dots, wherein the first electrode includes a first region and a second region spaced apart from each other, and the electrode pad is electrically coupled to the first and second regions, wherein a width of the first region of the first electrode is greater than a width of the second region of the first electrode.

2. The light emitting device of claim 1, wherein the first conductive semiconductor layer comprises a light extraction structure formed on an upper surface of the first conductive semiconductor layer.

3. The light emitting device of claim 1, wherein a partial region of the protective layer is provided under the electrode pad.

4. The light emitting device of claim 1, wherein the dots of the first electrode have a width in a range of 4 µm to 5 µm.

5. A light emitting device package including a light emitting device according to claim.

6. The light emitting device of claim 1, wherein a material of the first electrode is different from a material of the electrode pad.

7. The light emitting device of claim 1, wherein the second region of the first electrode includes a plurality of second regions, and a size of the plurality of second regions gradually reduces as the second regions are located away from the first region of the first electrode.

8. A light emitting device comprising: a light emitting structure comprising a first conductive semiconductor layer, a second conductive semiconductor layer under the first conductive semiconductor layer, and an active layer between the first conductive semiconductor layer and the second conductive semiconductor layer; a protective layer provided over the light emitting structure and including a plurality of holes; a first electrode including a plurality of metal dots provided through the holes of the protective layer, respectively, so as to be electrically coupled to the first conductive semiconductor layer, wherein the protective layer is provided around the first electrode configured as a plurality of metal dots; an electrode pad directly and electrically coupled to the first electrode; and a second electrode electrically coupled to the second conductive semiconductor layer, wherein the first electrode includes a first region and a second region spaced apart from each other, and the electrode pad is electrically coupled to the first and second regions, wherein a width of the first region of the first electrode is greater than a width of the second region of the first electrode.

9. The light emitting device of claim 8, wherein the first conductive semiconductor layer comprises a light extraction structure provided over an upper surface of the first conductive semiconductor layer.

10. The light emitting device of claim 8, wherein a partial region of the protective layer is provided under the electrode pad.

11. The light emitting device of claim 8, wherein the metal dots of the first electrode have a width in a range of 4 µm to 5 µm.

12. The light emitting device of claim 8, wherein the holes have a width in a range of 4 µm to 5 µm.

13. The light emitting device of claim 8, wherein a material of the first electrode is different from a material of the electrode pad.

14. The light emitting device of claim 8, wherein the second region of the first electrode includes a plurality of second regions, and a size of the plurality of second regions gradually reduces as the second regions are located away from the first region of the first electrode.

* * * * *